(12) United States Patent
Yamaguchi et al.

(10) Patent No.: US 10,777,550 B2
(45) Date of Patent: Sep. 15, 2020

(54) SEMICONDUCTOR DEVICE

(71) Applicant: MITSUBISHI ELECTRIC CORPORATION, Tokyo (JP)

(72) Inventors: Yutaro Yamaguchi, Tokyo (JP); Masatake Hangai, Tokyo (JP); Koji Yamanaka, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/465,537

(22) PCT Filed: Dec. 16, 2016

(86) PCT No.: PCT/JP2016/087562
§ 371 (c)(1),
(2) Date: May 30, 2019

(87) PCT Pub. No.: WO2018/109926
PCT Pub. Date: Jun. 21, 2018

(65) Prior Publication Data
US 2019/0296010 A1    Sep. 26, 2019

(51) Int. Cl.
*H01L 27/07*    (2006.01)
*H01L 49/02*    (2006.01)
(Continued)

(52) U.S. Cl.
CPC .......... *H01L 27/0727* (2013.01); *H01L 28/20* (2013.01); *H01L 28/40* (2013.01);
(Continued)

(58) Field of Classification Search
CPC ............. H01L 27/0727; H01L 23/4821; H01L 23/4824; H01L 29/41758; H01L 28/20; H01L 28/40; H01L 27/0705
See application file for complete search history.

(56) References Cited

U.S. PATENT DOCUMENTS 9,136,205 B2 * 9/2015 Shimura ............. H01L 23/4824
2007/0023897 A1 * 2/2007 Nakajima ............... H01L 24/49
257/728

(Continued)

FOREIGN PATENT DOCUMENTS

JP          5481357 B2       10/2007
WO    WO 2007/119266 A1    10/2007

OTHER PUBLICATIONS

Imai et al., "An 80-W Packaged GaN High Power Amplifier for CW Operation in the 13.75-14.5 GHz band", Microwave Symposium (IMS), 2014 IEEE MTT-S International, 2014, 4 pages.

*Primary Examiner* — Changhyun Yi
(74) *Attorney, Agent, or Firm* — Birch, Stewart, Kolasch & Birch, LLP

(57) ABSTRACT

A plurality of gate finger electrodes (2) is each arranged in a manner alternately adjacent to a corresponding one of drain electrodes (3) and a corresponding one of source electrode (4). The plurality of gate finger electrodes (2) is each connected to a corresponding one of gate routing lines (6). A resistor (7) has one end separating the gate routing lines (6) on respective two sides at a center portion between the gate routing lines (6), and has another end connected to an input line (10). Capacitors (8) are arranged on the respective two sides with respect to the resistor (7) and each connected to the corresponding gate routing line (6) by a corresponding one of air bridges (9).

6 Claims, 6 Drawing Sheets

(51) Int. Cl.
*H01L 29/417* (2006.01)
*H01L 29/423* (2006.01)
*H01L 29/772* (2006.01)
*H01L 29/808* (2006.01)
*H01L 23/482* (2006.01)

(52) U.S. Cl.
CPC .. *H01L 29/41758* (2013.01); *H01L 29/42316* (2013.01); *H01L 29/772* (2013.01); *H01L 29/808* (2013.01); *H01L 23/4821* (2013.01)

(56) References Cited

U.S. PATENT DOCUMENTS

2014/0027778 A1* 1/2014 Briere .................. H01L 29/778
257/76
2015/0137310 A1* 5/2015 Fillmore ............. H01L 21/7682
257/522

\* cited by examiner

SEMICONDUCTOR DEVICE

TECHNICAL FIELD

The present invention relates to a semiconductor device such as a field effect transistor.

BACKGROUND ART

In a high frequency power amplifier, it is necessary to stabilize characteristics of a transistor in order to suppress parasitic oscillation. As such a stabilizing method, there is a method of adding, to an input side of the transistor, a CR low frequency stabilizing circuit that is a circuit obtained by connecting capacitance C and resistance R in parallel.

In the CR low frequency stabilizing circuit, a high frequency component (a signal in a GHz range) passes through the capacitance C, and a low frequency component (a signal in a MHz range) that is a parasitic frequency passes through the resistor R. Consequently, only the low frequency component is lost, and thus parasitic oscillation caused by the low frequency component is suppressed.

For example, a high frequency/high output amplifier disclosed in Patent Literature 1 includes an input matching circuit for converting input impedance of a power transistor into high impedance, and a CR low frequency stabilizing circuit is provided in a preceding stage of this input matching circuit. With this structure, characteristics of the power transistor can be stabilized in a low frequency band.

CITATION LIST

Patent Literatures

Patent Literature 1: WO 2007/119266 A1

SUMMARY OF INVENTION

Technical Problem

In a so-called multi-finger transistor including a plurality of gate finger electrodes, there is a problem that parasitic loop oscillation occurs inside the transistor despite a fact that a CR low frequency stabilizing circuit is provided outside the transistor. For example, in the amplifier disclosed in Patent Literature 1, in a case where a power transistor is the multi-finger transistor, odd-mode loop oscillation may possibly occur inside the transistor. Particularly, millimeter wave loop oscillation is likely to occur in a transistor like a short gate transistor having a gain even in a millimeter wave region.

The present invention is made to solve the above-described problems and directed to providing a semiconductor device capable of stabilizing characteristics in a low frequency band and suppressing internal parasitic loop oscillation.

Solution to Problem

A semiconductor device according to the present invention includes a plurality of gate finger electrodes, gate routing lines, a first resistor, capacitors, and first air bridges. The plurality of gate finger electrodes is aligned in one direction and each arranged in a manner alternately adjacent to a corresponding one of the drain electrodes and a corresponding one of the source electrodes. The gate routing lines are provided along the direction in which the plurality of gate finger electrodes is aligned, and each of the plurality of gate finger electrodes is connected to a corresponding one of the gate routing lines. The first resistor has one end separating the gate routing lines on respective two sides at a center portion between the gate routing lines, and has another end connected to an input line. The capacitors are arranged on the respective two sides with respect to the first resistor. The first air bridges are provided along the respective gate routing lines and connects the capacitors to the respective gate routing lines.

Advantageous Effects of Invention

According to the present invention, since the resistor that separates the gate routing lines on the respective two sides at the center portion between the gate routing lines is provided, it is possible to stabilize characteristics in a low frequency band and suppress internal parasitic loop oscillation.

DESCRIPTION OF EMBODIMENTS

In the following, embodiments to carry out the present invention will be described with reference to the attached drawings in order to describe the present invention more in detail.

First Embodiment

Figure 1:
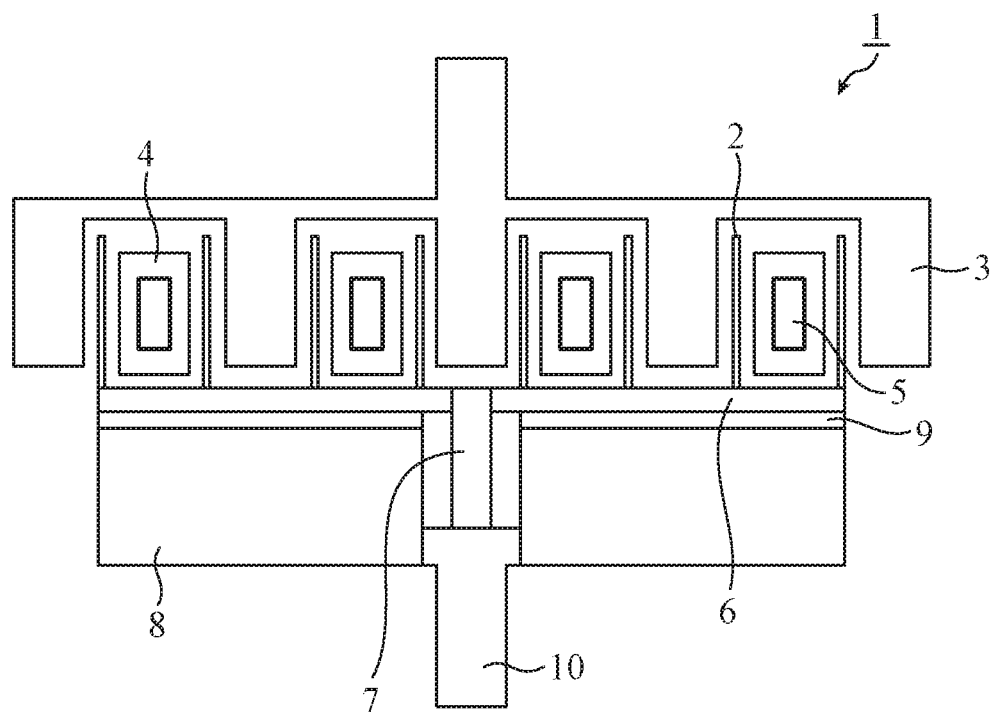
FIG. 1 is a top view illustrating a pattern layout of a semiconductor device according to a first embodiment of the present invention.

FIG. 1 is a top view illustrating a pattern layout of a semiconductor device 1 according to a first embodiment of the present invention, and illustrates a structure in which the semiconductor device according to the first embodiment is used in a multi-finger transistor. FIG. 1 illustrates the structure in which the number of the gate finger electrodes 2 is eight as an example, but the number of the gate finger electrodes 2 may be at two or more.

As illustrated in FIG. 1, the semiconductor device 1 includes, on the same substrate, the gate finger electrodes 2, drain electrodes 3, source electrodes 4, vias 5, gate routing lines 6, a resistor 7, capacitors 8, air bridges 9 and an input line 10.

The plurality of gate finger electrodes 2 is aligned in one direction on the substrate, and is each arranged in a manner alternately adjacent to a corresponding one of the drain electrodes 3 and a corresponding one of the source electrodes 4. In each source electrode 4 adjacent to corresponding two of the plurality of gate finger electrodes 2, a corresponding one of the vias 5 functioning as external terminals is formed immediately below the corresponding source electrode 4.

The gate routing lines 6 are provided along an alignment direction of the plurality of gate finger electrodes 2, and each of the plurality of gate finger electrodes 2 is vertically and directly connected to a corresponding one of the gate routing lines.

The resistor 7 is a first resistor which has one end separating the gate routing lines 6 on respective two sides at a center portion between the gate routing lines 6 and has another end connected to the input line 10. In other words, the resistor 7 is connected to three ports including the gate routing lines 6 on the two sides and the input line 10. The resistor 7 may be any one of an injection resistor formed by injecting impurities into the substrate, a thin film resistor including a thin layer of an insulator, and an epi resistor that is a resistor including an epitaxial layer.

As illustrated in FIG. 1, the capacitors 8 are capacitors arranged on the respective two sides with respect to the resistor 7 and each implemented by, for example, a metal-insulator-metal (MIM) capacitor. The air bridges 9 are first air bridges provided along the respective gate routing lines 6 and connecting the capacitors 8 to the respective gate routing lines 6.

In an amplifier described in Patent Literature 1, a CR low frequency stabilizing circuit is connected to the outside of a transistor. In contrast, in the semiconductor device 1 according to the first embodiment, since the gate routing lines 6 are separated on the two sides by connecting the one end of the resistor 7 to the center portion between the gate routing lines 6, the resistor 7 and the capacitors 8 function as a CR low frequency stabilizing circuit, and the resistor 7 also functions as an isolation resistor. With this structure, particularly, even in a transistor like a short gate transistor having a gain in a millimeter wave region, millimeter wave oscillation inside the transistor can be suppressed.

Figure 2A:
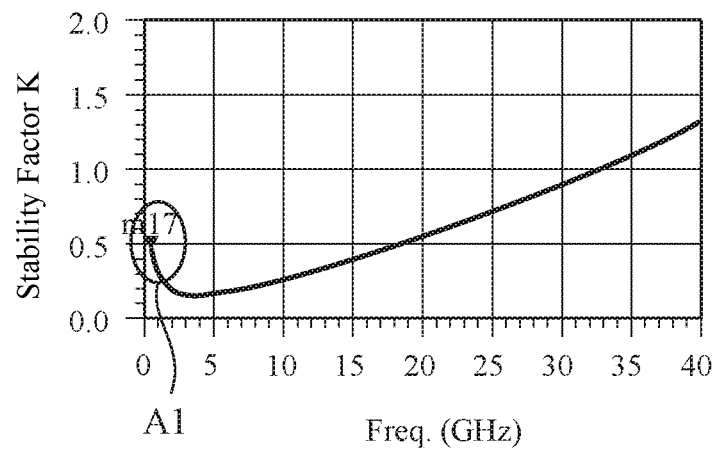
FIG. 2A is a graph illustrating a relation between a stability factor and a frequency in a semiconductor device in conventional art.
Figure 2B:
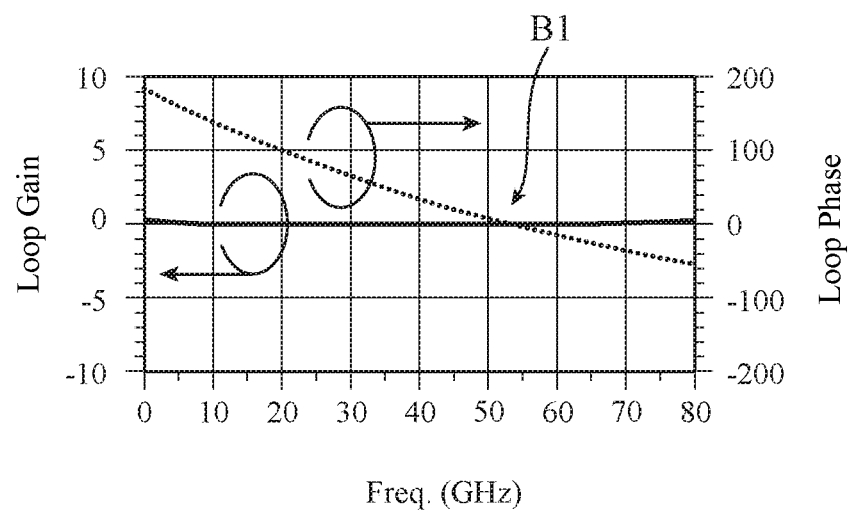
FIG. 2B is a graph illustrating a relation between a loop gain, a loop phase, and the frequency in the semiconductor device in the conventional art.

FIG. 2A is a graph illustrating a relation between a stability factor K and a frequency (GHz) in a semiconductor device in the conventional art. FIG. 2B is a graph illustrating a relation between a loop gain, a loop phase, and the frequency (GHz) in the semiconductor device in the conventional art. FIGS. 2A and 2B illustrate results obtained from verification on characteristics of the semiconductor device in the conventional art by using an existing microwave circuit simulator.

Figure 3A:
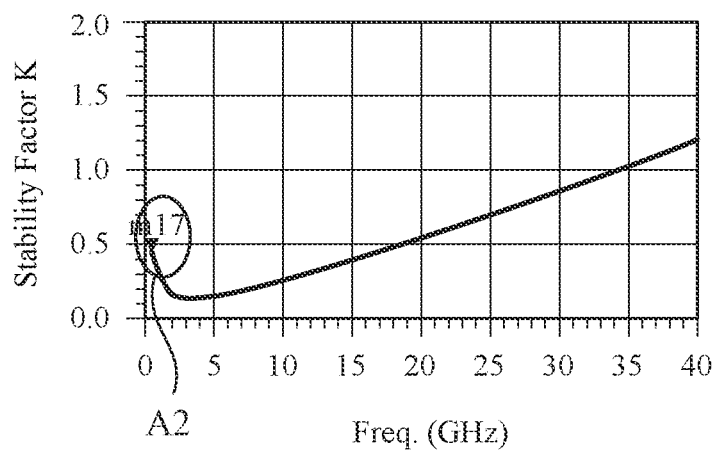
FIG. 3A is a graph illustrating a relation between a stability factor and a frequency in the semiconductor device according to the first embodiment.
Figure 3B:
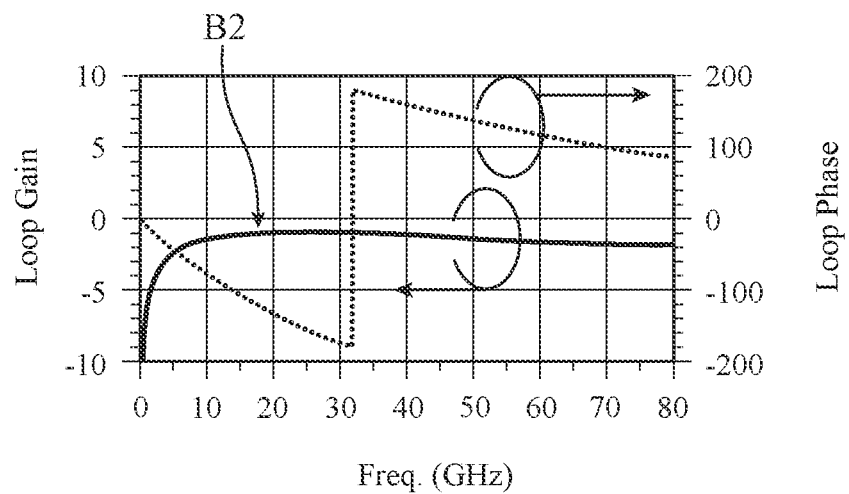
FIG. 3B is a graph illustrating the relation between a loop gain, a loop phase, and the frequency in the semiconductor device according to the first embodiment.

FIG. 3A is a graph illustrating a relation between a stability factor K and a frequency (GHz) in the semiconductor device 1. FIG. 3B is a graph illustrating a relation between a loop gain, a loop phase, and the frequency (GHz) in the semiconductor device 1. FIGS. 3A and 3B illustrate results obtained from verification on characteristics of the semiconductor device 1 illustrated in FIG. 1 by using the existing microwave circuit simulator.

The semiconductor device is simulated by a component model using: eight small-signal equivalent-circuit models each including one gate finger electrode with a length of 50 µm; and lines, a resistor, and MIM capacitors which are prepared on the existing microwave circuit simulator.

Additionally, the semiconductor device in the conventional art is a multi-finger transistor having a layout in which the resistor 7 is removed from the layout illustrated in FIG. 1, one end of an input line is directly connected to a gate routing line, and another end of the input line is connected to a CR low frequency stabilizing circuit.

Since the semiconductor device in the conventional art includes the CR low frequency stabilizing circuit, the stability factor K is increased in a low frequency band and the characteristics in the low frequency band is stabilized as indicated by reference sign A1 in FIG. 2A.

Also in the semiconductor device 1, since the resistor 7 and the capacitors 8 function as the CR low frequency stabilizing circuit, the stability factor K is increased in the low frequency band and the characteristics in the low frequency band is stabilized as indicated by reference sign A2 in FIG. 3A.

However, in the semiconductor device in the conventional art, the loop gain is substantially 0 dB at a frequency in the vicinity of 55 GHz, and the loop phase is substantially 0 deg. as indicated by reference sign B1 in FIG. 2B. This is a state in which loop oscillation is likely to occur.

In contrast, since the resistor 7 functions as the isolation resistor in the semiconductor device 1, it is found that the loop gain is suppressed to a value equal to or less than 0 dB even in a millimeter wave frequency band as indicated by reference sign B2 in FIG. 3B, and loop oscillation can be suppressed.

FIG. 1 illustrates a case where intervals between adjacent gate finger electrodes 2 are uniform, but the layout of the semiconductor device 1 according to the first embodiment is not limited to the layout in which the intervals between the adjacent gate finger electrodes 2 are uniform. For example, in a case where a width of the resistor 7 cannot be narrowed due to restrictions on a process, it may be possible to have a layout in which only an interval between adjacent gate finger electrodes 2 in the vicinity of the resistor 7, that is, the interval between the adjacent gate finger electrodes 2 at a center of the transistor is widen. Even with this configuration, the above-described effects can be obtained.

As described above, in the semiconductor device 1 according to the first embodiment, the plurality of gate finger electrodes 2 is aligned in one direction, and is each arranged in a manner alternately adjacent to the corresponding drain electrode 3 and the corresponding source electrode 4. The gate routing lines 6 are provided along the alignment direction of the plurality of gate finger electrodes 2, and each of the plurality of gate finger electrodes 2 is connected to the corresponding gate routing line 6. The resistor 7 has the one end separating the gate routing lines 6 on the respective two sides at the center portion between the gate routing lines 6, and has the other end connected to the input line 10. The capacitors 8 are arranged on the respective two sides with respect to the resistor 7. The air bridges 9 are provided along the respective gate routing lines 6 and connect the capacitors 8 to the respective gate routing lines 6. Thus, since the resistor 7 that separates the gate routing lines 6 on the two sides at the center portion between the gate routing lines 6 is provided, it is possible to stabilize characteristics in a low frequency band and suppress internal parasitic loop oscillation.

Second Embodiment

Figure 4:
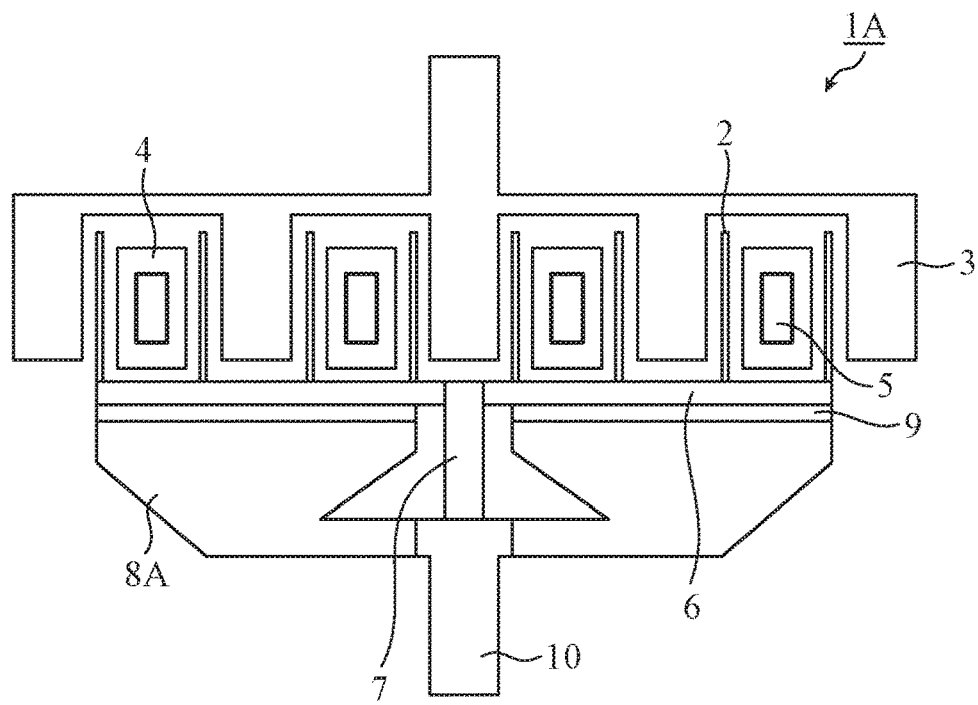
FIG. 4 is a top view illustrating a pattern layout of a semiconductor device according to a second embodiment of the present invention.

FIG. 4 is a top view illustrating a pattern layout of a semiconductor device 1A according to a second embodiment of the present invention, and illustrates a structure in which the semiconductor device according to the second embodiment is used in a multi-finger transistor. Note that, in FIG. 4, components same as those in FIG. 1 will be denoted by the same reference signs and description thereof will be omitted. As illustrated in FIG. 4, the semiconductor device 1A includes, on the same substrate, gate finger electrodes 2, drain electrodes 3, source electrodes 4, vias 5, gate routing lines 6, a resistor 7, capacitors 8A, air bridges 9, and an input line 10.

Each capacitor 8 has a rectangle shape when viewed from the top, but each capacitor 8A has a shape obtained by obliquely cutting an outer corner of the rectangle shape on an input side so as to narrow the input side and further cutting an inner side portion of the rectangle shape adjacent to the resistor 7 so as to narrow the input side as illustrated in FIG. 4.

With this configuration, it is possible to reduce an amplitude difference and a phase difference of power input to the gate finger electrodes 2.

Note that the case of obliquely cutting the corner portion has been described, but the corner portion may be rounded off.

In other words, in a case where each capacitor 8A has a shape in which the rectangle shape is partially removed by obliquely cutting the corner portion, cutting the inner side portion, or rounding off the corner portion, the same effect as described above can be obtained.

In a case where the capacitor has a square shape, a distance from a distribution point of input power to a gate finger electrode 2 located on an inner side is shorter than a distance from the distribution point to a gate finger electrode 2 located on an outer side. Therefore, the input power flowing toward the gate finger electrode 2 located on the inner side is more increased, whereas the input power flowing toward the gate finger electrode 2 located on the outer side is more decreased. Thus, unequal distribution occurs.

In contrast, in the case of having the shape obtained by the above-described cutting or the like, the distance from the distribution point to the gate finger electrode 2 located on the inner side is equal to the distance from the distribution point to the gate finger electrode 2 located on the outer side, and therefore, the input power is equally distributed to the gate finger electrode 2 located on the inner side and the gate finger electrode 2 located on the outer side. Consequently, the power is input to the transistor more efficiently.

As described above, in the semiconductor device 1A according to the second embodiment, each capacitor 8A has the shape obtained by partially removing the rectangle shape. With this configuration, it is possible to reduce the amplitude difference and the phase difference of the power input to the gate finger electrodes 2.

Third Embodiment

Figure 5:
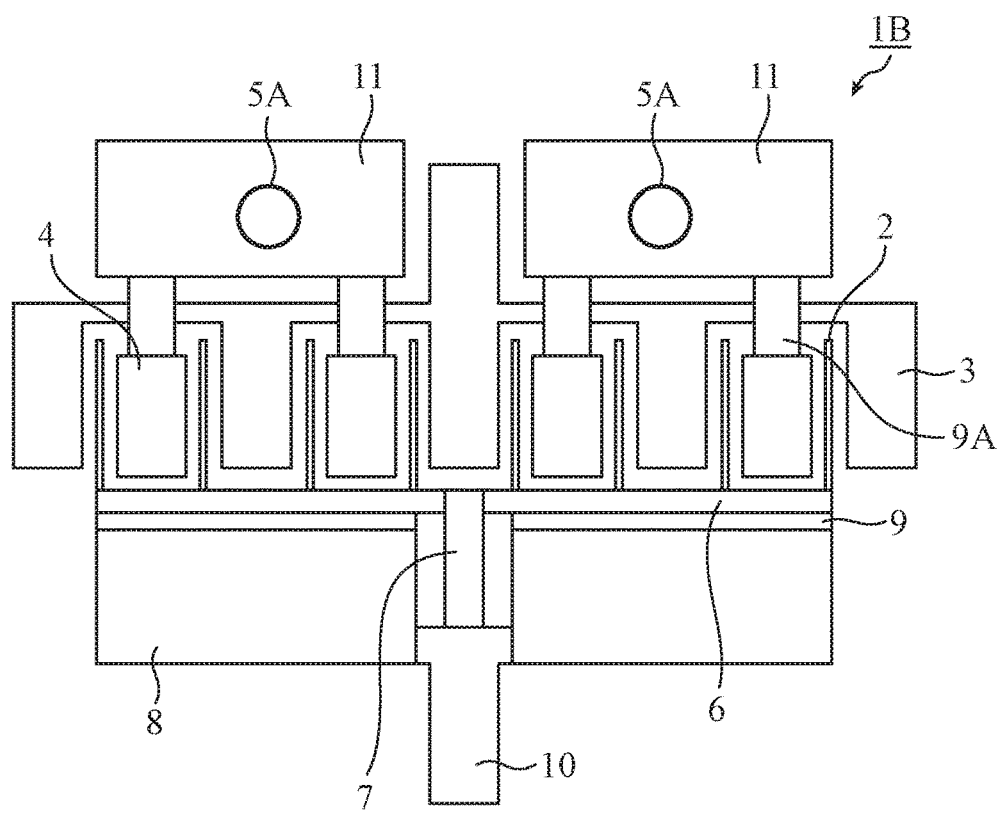
FIG. 5 is a top view illustrating a pattern layout of a semiconductor device according to a third embodiment of the present invention.

FIG. 5 is a top view illustrating a pattern layout of a semiconductor device 1B according to a third embodiment of the present invention, and illustrates a structure in which the semiconductor device according to the third embodiment is used in a multi-finger transistor. Note that, in FIG. 5, components same as those in FIG. 1 will be denoted by the same reference signs and description thereof will be omitted.

As illustrated in FIG. 5, the semiconductor device 1B includes, on the same substrate, gate finger electrodes 2, drain electrodes 3, source electrodes 4, vias 5A, gate routing lines 6, a resistor 7, capacitors 8, air bridges 9, air bridges 9A, an input line 10, and external electrodes 11.

Each via 5A is a via functioning as an external terminal and formed immediately below a corresponding one of the external electrodes 11.

Each air bridge 9A is a second air bridge connecting a corresponding one of the source electrodes 4 to a corresponding one of the external electrodes 11.

As illustrated in FIG. 1, vias 5 are formed immediately below respective source electrodes 4 in a semiconductor device 1. For this reason, it is necessary to widen a width of each source electrode 4 due to restrictions on a process of forming the via 5. This may cause limitation on reduction of a transistor size.

In contrast, in the semiconductor device 1B as mentioned above, the vias 5 are not formed immediately below the respective source electrodes 4, and the vias 5A are formed immediately below the respective external electrodes 11, which are connected to the source electrodes 4 by the respective air bridges 9A. Since this eliminates the above-described restrictions on the process, the width of each source electrode 4 can be narrowed. Therefore, the transistor size can be reduced.

Note that, in FIG. 5, the layout in which the external electrodes 11 are arranged across the drain electrodes 3 and distant from an input side is illustrated, but the external electrodes 11 may be provided on both sides of the semiconductor device.

In this case, a source routing line connected to source electrodes 4 on one side of the semiconductor device is connected to the external electrode 11 located on the same side by at least one air bridge extending over drain electrodes 3, and another side of the semiconductor device also has the similar configuration.

As described above, the semiconductor device 1B according to the third embodiment includes: the external electrodes 11 in each of which the corresponding via 5A is formed; and the air bridges 9A connecting the respective source electrodes 4 to the external electrodes 11. With this configuration, the width of each source electrode 4 can be narrowed, and the transistor size can be reduced.

Note that the capacitors 8 in the semiconductor device 1B may be replaced with respective capacitors 8A described in a second embodiment. With this configuration, not only the effects of the third embodiment but also effects of the second embodiment can be obtained.

Fourth Embodiment

Figure 6:
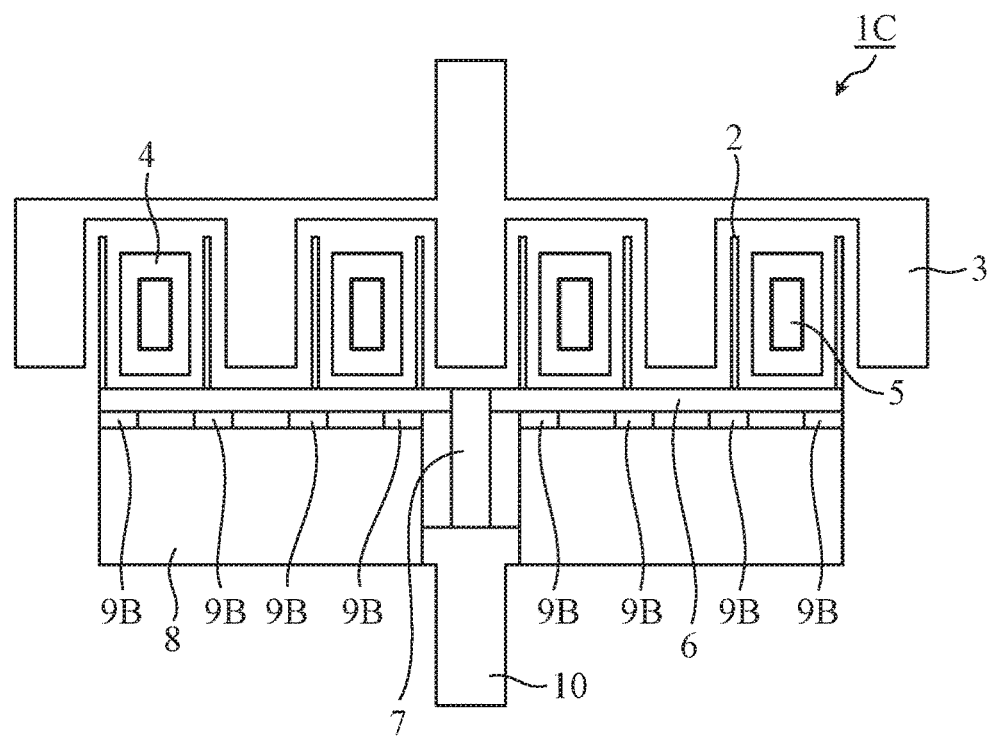
FIG. 6 is a top view illustrating a pattern layout of a semiconductor device according to a fourth embodiment of the present invention.

FIG. 6 is a top view illustrating a pattern layout of a semiconductor device 1C according to a fourth embodiment of the present invention, and illustrates a structure in which the semiconductor device according to the fourth embodiment is used in a multi-finger transistor. Note that, in FIG. 6, components same as those in FIG. 1 will be denoted by the same reference signs and description thereof will be omitted. As illustrated in FIG. 6, the semiconductor device 1C includes, on the same substrate, gate finger electrodes 2, drain electrodes 3, source electrodes 4, vias 5, gate routing lines 6, a resistor 7, capacitors 8, air bridges 9B, and an input line 10.

The air bridges 9B are third air bridges which are provided in a manner corresponding to the respective plurality of gate finger electrodes 2, and which connect the capacitors 8 to the respective gate routing lines 6. No pattern is formed between the air bridges 9B adjacent to each other. With this configuration, power is equally distributed to each of the gate finger electrodes 2 via a corresponding one of the plurality of air bridges 9B, and therefore, it is possible to reduce an amplitude difference and a phase difference of the power input to the gate finger electrodes 2.

As described above, in the semiconductor device 1C according to the fourth embodiment, the plurality of gate finger electrodes 2 is aligned in one direction, and is each arranged in a manner alternately adjacent to the corresponding drain electrode 3 and the corresponding source electrode 4. The gate routing lines 6 are provided along an alignment direction of the plurality of gate finger electrodes 2, and each of the plurality of gate finger electrodes 2 is connected to the corresponding gate routing line 6. The resistor 7 has one end separating the gate routing lines 6 on respective two sides at a center portion between the gate routing lines 6, and has another end connected to the input line 10. The capacitors 8 are arranged on the respective two sides with respect to the resistor 7. The plurality of air bridges 9B is provided in a manner corresponding to the respective plurality of gate finger electrodes 2, and connects the capacitors 8 to the respective gate routing lines 6.

With this configuration, it is possible to reduce the amplitude difference and the phase difference of the power input to the gate finger electrodes 2.

Note that the capacitors 8 in the semiconductor device 1C may be replaced with respective capacitors 8A described in a second embodiment. This configuration is defined as a configuration A. With this configuration, not only the effects of the fourth embodiment but also effects of the second embodiment can be obtained.

Additionally, as illustrated in FIG. 5, external electrodes 11 illustrated in a third embodiment may be provided without forming a via 5 in each source electrode 4 in the semiconductor device 1C or the semiconductor device having the configuration A. With this configuration, effects of the third embodiment can also be obtained.

Fifth Embodiment

Figure 7:
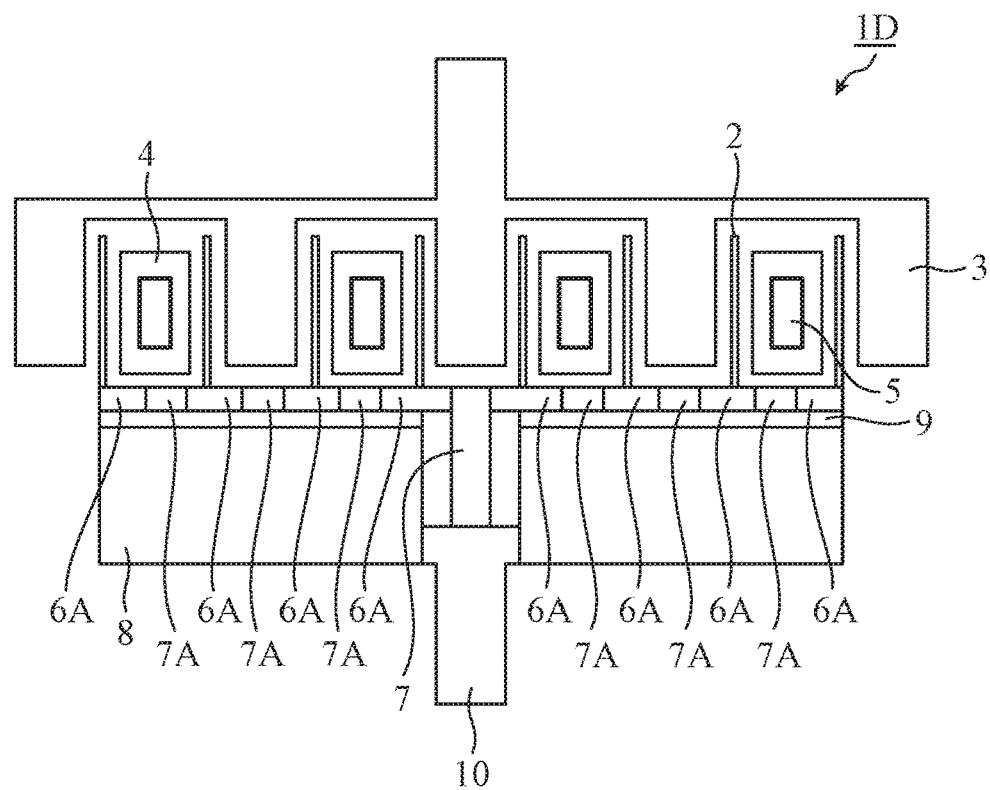
FIG. 7 is a top view illustrating a pattern layout of a semiconductor device according to a fifth embodiment of the present invention.

FIG. 7 is a top view illustrating a pattern layout of a semiconductor device 1D according to a fifth embodiment of the present invention, and illustrates a structure in which the semiconductor device according to the fifth embodiment is used in a multi-finger transistor. Note that, in FIG. 7, components same as those in FIG. 1 will be denoted by the same reference signs and description thereof will be omitted. As illustrated in FIG. 7, the semiconductor device 1D includes, on the same substrate, gate finger electrodes 2, drain electrodes 3, source electrodes 4, vias 5, gate routing lines 6A, a resistor 7, resistors 7A, capacitors 8, air bridges 9, and an input line 10.

As illustrated in FIG. 7, each gate routing line 6A includes one of the resistors 7A in a portion corresponding to that between any adjacent two of the gate finger electrodes 2.

Each resistor 7A is a second resistor connecting adjacent portions of the corresponding gate routing line 6A. Similar to the resistor 7, the resistor 7A may be any one of an injection resistor, a thin film resistor, and an epi resistor. Since each resistor 7A acts as an isolation resistor for every loop generated between the adjacent gate finger electrodes 2, it is possible to suppress loop oscillation in all of modes.

As described above, in the semiconductor device 1D according to the fifth embodiment, each gate routing line 6A includes the resistor 7A in the portion corresponding to that between the adjacent gate finger electrodes 2. With this configuration, it is possible to suppress the loop oscillation in all of the modes.

Note that the capacitors 8 in the semiconductor device 1D may be replaced with respective capacitors 8A described in a second embodiment. This configuration is defined as a configuration B. With this configuration, not only the effects of the fifth embodiment but also effects of the second embodiment can be obtained.

Additionally, external electrodes 11 illustrated in a third embodiment may be provided without forming a via 5 in each source electrode 4 in the semiconductor device 1D or the semiconductor device having the configuration B. With this configuration, effects of the third embodiment can also be obtained.

Sixth Embodiment

Figure 8:
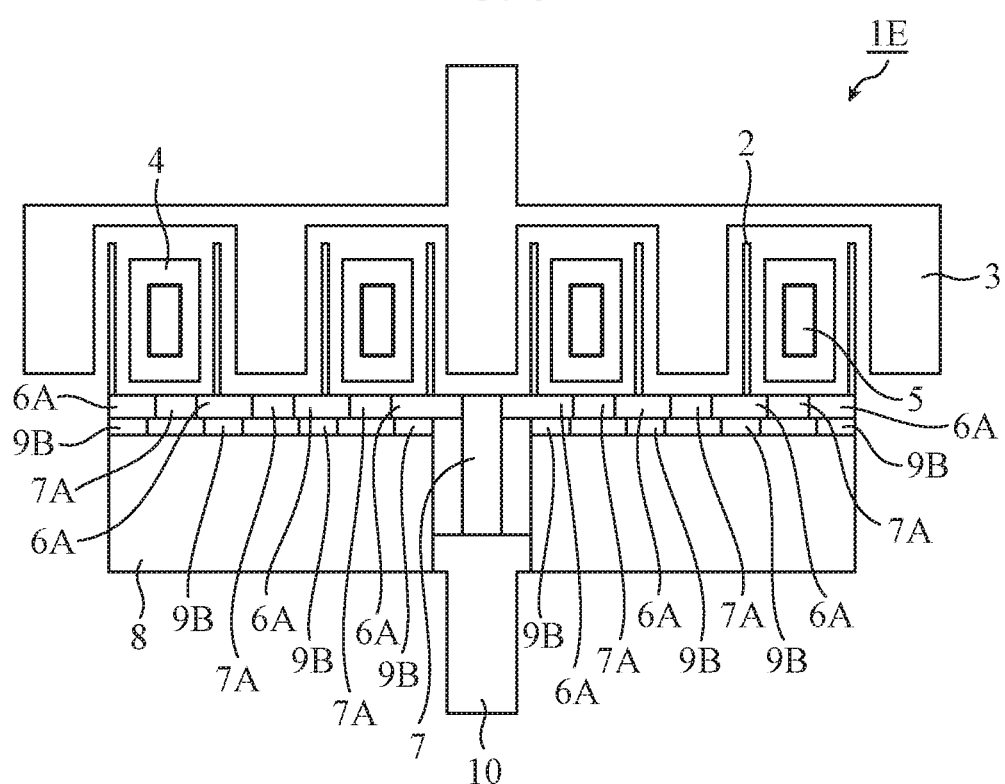
FIG. 8 is a top view illustrating a pattern layout of a semiconductor device according to a sixth embodiment of the present invention.

FIG. 8 is a top view illustrating a pattern layout of a semiconductor device 1E according to a sixth embodiment of the present invention, and illustrates a structure in which the semiconductor device according to the sixth embodiment is used in a multi-finger transistor. Note that, in FIG. 8, components same as those in FIG. 1 will be denoted by the same reference signs and description thereof will be omitted. As illustrated in FIG. 8, the semiconductor device 1E includes, on the same substrate, gate finger electrodes 2, drain electrodes 3, source electrodes 4, vias 5, gate routing lines 6A, a resistor 7, resistors 7A, capacitors 8, air bridges 9B, and an input line 10.

Similar to a fifth embodiment, each gate routing line 6A includes one of the resistors 7A in a portion corresponding to that between any adjacent two of the gate finger electrodes 2. Since each resistor 7A acts as an isolation resistor for every loop generated between the adjacent gate finger electrodes 2, it is possible to suppress loop oscillation in all of modes.

Each of the plurality of air bridges 9B is connected to a corresponding portion of the gate routing lines 6A, the portion being located between any adjacent two of the resistors 7A. With this configuration, it is possible to reduce an amplitude difference and a phase difference of power input to the gate finger electrodes 2.

As described above, in the semiconductor device 1E according to the sixth embodiment, each gate routing line 6A includes the resistor 7A in the portion corresponding to that between the adjacent gate finger electrodes 2. Each of the plurality of air bridges 9B is connected to the corresponding portion of the gate routing lines 6A, the portion being located between the adjacent resistors 7A. With this configuration, it is possible to suppress loop oscillation in all of the modes and reduce the amplitude difference and the phase difference of the power input to the gate finger electrodes 2.

Note that the capacitors 8 in the semiconductor device 1E may be replaced with respective capacitors 8A described in a second embodiment. This configuration is defined as a configuration C. With this configuration, not only the effects of the sixth embodiment but also effects of the second embodiment can be obtained.

Additionally, external electrodes 11 illustrated in a third embodiment may be provided without forming a via 5 in each source electrode 4 in the semiconductor device 1E or the semiconductor device having the configuration C. With this configuration, effects of the third embodiment can also be obtained.

Meanwhile, in the present invention, the embodiments can be freely combined, any component in the embodiments can be modified, or any component in the embodiments can be omitted within the scope of the present invention.

INDUSTRIAL APPLICABILITY

The semiconductor device according to the present invention is preferably used in, for example, a high frequency power amplifier because the characteristics in the low frequency band can be stabilized and additionally internal parasitic loop oscillation can be suppressed.

REFERENCE SIGNS LIST 1, 1A to 1E Semiconductor device
2 Gate finger electrode
3 Drain electrode
4 Source electrode
5, 5A Via
6, 6A Gate routing line
7, 7A Resistor
8, 8A Capacitor
9, 9A, 9B Air bridge
10 Input line
11 External electrode

The invention claimed is:

1. A semiconductor device comprising:
a plurality of gate finger electrodes which is aligned in one direction, and each of which is arranged in a manner alternately adjacent to a corresponding one of drain electrodes and a corresponding one of source electrodes;
gate routing lines provided along the direction in which the plurality of gate finger electrodes is aligned, each of the plurality of gate finger electrodes being connected to a corresponding one of the gate routing lines;
a first resistor having one end separating the gate routing lines on respective two sides at a center portion between the gate routing lines, and having another end connected to an input line;
capacitors arranged on the respective two sides with respect to the first resistor; and
first air bridges provided along the respective gate routing lines and connecting the capacitors to the respective gate routing lines.

2. The semiconductor device according to claim 1, wherein each of the capacitors has a shape in which a rectangle shape is partially removed.

3. The semiconductor device according to claim 1, further comprising:
external electrodes in each of which a via is formed; and
second air bridges each connecting a corresponding one of the source electrodes to a corresponding one of the external electrodes.

4. The semiconductor device according to claim 1, wherein each of the gate routing lines includes a second resistor in a portion corresponding to that between any adjacent two of the gate finger electrodes.

5. A semiconductor device comprising:
a plurality of gate finger electrodes which is aligned in one direction, and each of which is arranged in a manner alternately adjacent to a corresponding one of drain electrodes and a corresponding one of source electrodes;
gate routing lines provided along the direction in which the plurality of gate finger electrodes is aligned, each of the plurality of gate finger electrodes being connected to a corresponding one of the gate routing lines;
a first resistor having one end separating the gate routing lines on respective two sides at a center portion between the gate routing lines, and having another end connected to an input line;
capacitors arranged on the respective two sides with respect to the first resistor; and
a plurality of third air bridges provided in a manner corresponding to the respective plurality of gate finger electrodes, and connecting the capacitors to the respective gate routing lines.

6. The semiconductor device according to claim 5, wherein
each of the gate routing lines includes a second resistor in a portion corresponding to that between any adjacent two of the gate finger electrodes, and
each of the plurality of third air bridges is connected to a corresponding portion of the gate routing lines, the portion being located between any adjacent two of the second resistors.

* * * * *